(12) United States Patent
Yu et al.

(10) Patent No.: US 11,864,418 B2
(45) Date of Patent: Jan. 2, 2024

(54) DISPLAY PANEL, PREPARATION METHOD THEREOF AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Pengfei Yu, Beijing (CN); Lu Bai, Beijing (CN); Jie Dai, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 225 days.

(21) Appl. No.: 17/419,864

(22) PCT Filed: Sep. 17, 2020

(86) PCT No.: PCT/CN2020/115967
§ 371 (c)(1),
(2) Date: Jun. 30, 2021

(87) PCT Pub. No.: WO2022/056785
PCT Pub. Date: Mar. 24, 2022

(65) Prior Publication Data
US 2022/0320188 A1  Oct. 6, 2022

(51) Int. Cl.
*H10K 59/121* (2023.01)
*H01L 23/544* (2006.01)
(Continued)

(52) U.S. Cl.
CPC ......... *H10K 59/121* (2023.02); *H01L 23/544* (2013.01); *H10K 50/841* (2023.02);
(Continued)

(58) Field of Classification Search
CPC .... H10K 59/121; H10K 50/841; H10K 59/40; H10K 71/00; H10K 59/1201; H01L 23/544; H01L 2223/54426
See application file for complete search history.

(56) References Cited

U.S. PATENT DOCUMENTS 10,454,061 B2 * 10/2019 Jo ................. H10K 77/111

FOREIGN PATENT DOCUMENTS

| CN | 105116580 A | 12/2015 |
|---|---|---|
| CN | 105182697 A | 12/2015 |

(Continued)

*Primary Examiner* — Kyoung Lee
(74) *Attorney, Agent, or Firm* — HOUTTEMAN LAW LLC

(57) ABSTRACT

Embodiments of the present disclosure provide a display panel, including: a display substrate, wherein the display substrate includes a display area and a bezel area arranged around a periphery of the display area, the bezel area including a first area arranged around the periphery of the display area, and a second area arranged around a periphery of the first area; and the display substrate further includes a plurality of electrical functional layers located at different levels respectively and at least part of film layers therein being partially superposed; wherein at least part of the electrical functional layers are distributed in the display area, and at least part of the electrical functional layers are distributed in the first area and the second area, the first area having a higher light transmittance than the second area and the display area.

20 Claims, 5 Drawing Sheets

(51) Int. Cl.
  *H10K 50/84*   (2023.01)
  *H10K 59/40*   (2023.01)
  *H10K 71/00*   (2023.01)
  *H10K 59/12*       (2023.01)

(52) U.S. Cl.
  CPC ............ *H10K 59/40* (2023.02); *H10K 71/00* (2023.02); *H01L 2223/54426* (2013.01); *H10K 59/1201* (2023.02)

(56) References Cited

FOREIGN PATENT DOCUMENTS

| | | |
|---|---|---|
| CN | 108132554 A | 6/2018 |
| CN | 108511619 A | 9/2018 |
| CN | 108572477 A | 9/2018 |
| CN | 109445172 A | 3/2019 |
| CN | 111244135 A | 6/2020 |
| KR | 20130065265 A | 6/2013 |

\* cited by examiner

DISPLAY PANEL, PREPARATION METHOD THEREOF AND DISPLAY DEVICE

CROSS-REFERENCE TO RELATED APPLICATION

This application is a National Phase Application filed under 35 U.S.C. 371 as a national stage of PCT/CN2020/115967, filed on Sep. 17, 2020, the contents of which are incorporated herein by reference in their entirety.

TECHNICAL FIELD

Embodiments of the present disclosure belong to the field of display technologies, and particularly relate to a display panel, a preparation method thereof and a display device.

BACKGROUND

Flexible display panels, using organic light-emitting diodes (OLEDs) as light-emitting devices and using thin film transistors for signal control, have become the current mainstream direction of the OLED industry. During production and preparation of display panels, alignment is required in a large number of processes such as exposure, cutting, binding, bonding and the like, which involves an apparatus locking the position of the display panel by a cameral automatically identifying a specific pattern (hereinafter "mark") deposited around or in the display panel in advance, so that the process precision is ensured.

SUMMARY

Embodiments of the present disclosure provide a display panel, a preparation method thereof and a display device.

In a first aspect, an embodiment of the present disclosure provides a display panel, including: a display substrate, wherein the display substrate includes a display area and a bezel area arranged around a periphery of the display area, the bezel area including a first area arranged around the periphery of the display area, and a second area arranged around a periphery of the first area; and the display substrate further includes a plurality of electrical functional layers located at different levels respectively and at least part of film layers therein being partially superposed; wherein at least part of the electrical functional layers are distributed in the display area, and at least part of the electrical functional layers are distributed in the first area and the second area, the first area having a higher light transmittance than the second area and the display area.

In some embodiments, the first area has a width in a range of 10 to 350 μm in a direction away from the display area.

In some embodiments, the display substrate includes a transistor and an organic light-emitting diode electrically connected to the transistor;

each of the electrical functional layers includes a semiconductor layer, a gate layer, a source drain metal layer and an anode layer;

the semiconductor layer includes an active layer of the transistor; the gate layer includes a gate line and a gate of the transistor; the source drain metal layer includes a source and a drain of the transistor, a data line and a power line; and the anode layer includes an anode of the organic light-emitting diode; and a distribution density of the electrical functional layers and the superposed parts thereof in the display area is greater than that in the first area, and less than that in the second area.

In some embodiments, the display panel further includes a touch layer disposed on a light-emitting side of the display substrate; wherein the touch layer includes a touch area and a wiring area arranged around a periphery of the touch area;

the display area falls into an orthographic projection of the touch area on the display substrate; in a plane of the display substrate along the direction away from the display area, an orthographic projection of the wiring area on the display substrate is located on a side of the first area away from the display area, and the wiring area is spaced from the first area by a first distance; and at least one pair of position areas distributed oppositely in the first area serve as alignment marks when the touch layer is disposed on the display substrate.

In some embodiments, the first distance is greater than 0 and less than a width of the second area in the direction away from the display area.

In some embodiments, the display panel further includes a cover plate disposed on a side of the touch layer away from the display substrate; wherein the cover plate includes a central area and an ink area arranged around a periphery of the central area;

the display area falls into an orthographic projection of the central area on the display substrate, and in the plane of the display substrate along the direction away from the display area, the ink area is located on the side of the first area away from the display area, and spaced from the first area by a second distance; and at least one pair of position areas which are distributed oppositely in the first area serve as alignment marks when the cover plate is disposed on the display substrate.

In some embodiments, the second distance is greater than 0 and less than a width of the second area in the direction away from the display area.

In some embodiments, the second distance is greater than the first distance.

In some embodiments, the touch layer is disposed such that a width L of the alignment mark in the direction away from the display area satisfies L≤(B−Δb)/k, where 0<k<1; wherein B is the first distance; Δb is a setting tolerance of the touch layer; and k is a minimum width change rate of the alignment mark recognizable by an alignment device.

In some embodiments, the cover plate is disposed such that a width L of the alignment mark in the direction away from the display area satisfies L≤(C−Δc)/k (1−k), where 0<k<1; wherein C is the second distance; Δc is a setting tolerance of the cover plate; and k is a minimum width change rate of the alignment mark recognizable by an alignment device.

In some embodiments, the display area has a rounded quadrangle shape, and a pair of diagonal position areas in the first area corresponding to a pair of diagonal position areas of the rounded quadrangle serve as the alignment marks.

In some embodiments, the display area has a rounded quadrangle shape, and two pairs of diagonal position areas in the first area corresponding to two pairs of diagonal position areas of the rounded quadrangle serve as the alignment marks.

In some embodiments, a position area serving as the alignment mark is provided on each of at least one set of opposite sides in the first area corresponding to at least one set of opposite sides of the rounded quadrangle.

In some embodiments, the first area as a whole serves as the alignment mark.

In some embodiments, the display area has a polygon shape, two angular position areas in the first area corresponding to two angular position areas of the polygon serve as the alignment marks, and the two angular position areas of the polygon are opposite to each other.

In some embodiments, the display area has a polygon shape, and each angular position area in the first area corresponding to each angular position area of the polygon serves as the alignment mark.

In some embodiments, a position area as the alignment mark is provided on each side in the first area corresponding to each side of the polygon.

In a second aspect, an embodiment of the present disclosure provides a display device including the display panel as described above.

In a third aspect, an embodiment of the present disclosure provides a method for preparing a display panel, including: preparing a display substrate; wherein the display substrate includes a display area and a bezel area arranged around a periphery of the display area, the bezel area including a first area arranged around the periphery of the display area, and a second area arranged around a periphery of the first area; and preparing the display substrate includes preparing a plurality of electrical functional layers located at different levels respectively and at least part of film layers therein partially superposed; wherein at least part of the electrical functional layers are distributed in the display area, and at least part of the electrical functional layers are distributed in the first area and the second area, the first area having a higher light transmittance than the second area and the display area.

In some embodiments, the method further includes: preparing a touch layer on a light-emitting side of the display substrate; wherein preparing the touch layer on the light-emitting side of the display substrate includes: aligning the touch layer with the display substrate; and using at least one pair of position areas which are distributed oppositely in the first area as alignment marks when the touch layer is prepared; and aligning the touch layer with the display substrate includes:

aligning the touch layer with the display substrate so that a touch area of the touch layer corresponds to the display area of the display substrate, and so that each position area of the display substrate serving as the alignment mark has the same exposed width relative to a wiring area of the touch layer.

In some embodiments, the method further includes: preparing a cover plate on a side of the touch layer away from the display substrate; wherein preparing the cover plate on the side of the touch layer away from the display substrate includes: aligning the cover plate with the display substrate having the touch layer; using at least one pair of position areas which are distributed oppositely in the first area as alignment marks when the cover plate is prepared; and aligning the cover plate with the display substrate having the touch layer includes:

aligning the cover plate with the display substrate so that a central area of the cover plate corresponds to the display area of the display substrate, and so that each position area of the display substrate serving as the alignment mark has the same exposed width relative to an ink area of the cover plate.

BRIEF DESCRIPTION OF THE DRAWINGS

Accompanying drawings are provided for further understanding of the embodiments of the disclosure and constitute a part of the specification. Hereinafter, these drawings are intended to explain the disclosure together with the following embodiments, but should not be considered as a limitation to the disclosure. The above and other features and advantages will become more apparent to those skilled in the art through detailed description of the exemplary embodiments with reference to the accompanying drawings, in which.

Figure 1:
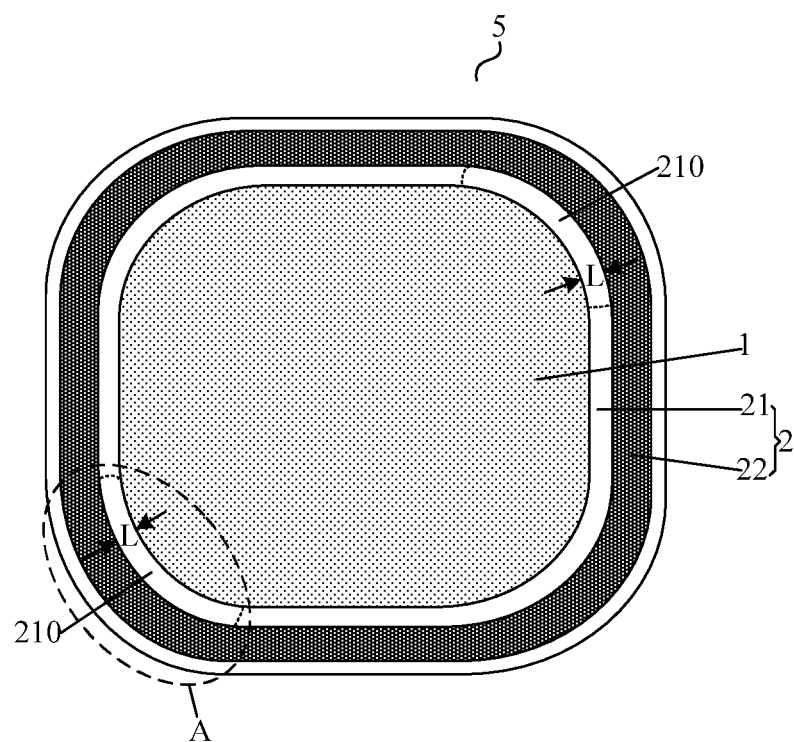
FIG. 1 is a top view of a display substrate in a display panel according to an embodiment of the present disclosure.

The reference signs therein are listed below:

1. display area; 2. bezel area; 21. first area; 210. position area; 22. second area; 3. touch layer; 31. touch area; 32. wiring area; 4. cover plate; 41. central area; 42. ink area; 5. display substrate.

DETAILED DESCRIPTION OF THE EMBODIMENTS

In order to make those skilled in the art better understand the technical solutions in the embodiments of the present disclosure, the display panel, the preparation method thereof and the display device provided in the embodiments of the present disclosure are described in further detail below with reference to the accompanying drawings and specific embodiments.

Embodiments of the present disclosure will be described more sufficiently below with reference to the accompanying drawings, but which may be embodied in different forms and should not be construed as limited to the embodiments set forth in the disclosure. Rather, these embodiments are provided so that this disclosure will be thorough and complete, and will fully convey the scope of the disclosure to those skilled in the art.

The embodiments of the present disclosure are not limited to the embodiments shown in the drawings, but include modifications of configurations formed based on a manufacturing process. Thus, the areas illustrated in the figures have schematic properties, and the shapes of the areas shown in the figures exemplarily illustrate specific shapes of the areas, but are not intended to be limiting.

When an OLED (organic light-emitting diode) display backplane has reached the cover plate glass bonding process after all the previous processes, redundant corners of the display backplane have been removed through laser cutting, leaving no spare space for placing an alignment mark. At the moment, positioning of the display backplane by a camera can only depend on structures in the display backplane that are easy to identify after imaging. Therefore, the display backplane also needs to be adjusted to meet the requirements for pattern recognition by the camera and alignment precision, while not affecting the basic structure and the display effect of the display panel.

In view of the problem that no spare space is available for placing an alignment mark in the cover plate glass bonding process and the design concept that some structures in the display backplane that are easy to identify after imaging can serve as alignment marks, embodiments of the present disclosure provide a display panel, a preparation method thereof and a display device.

Figure 2:
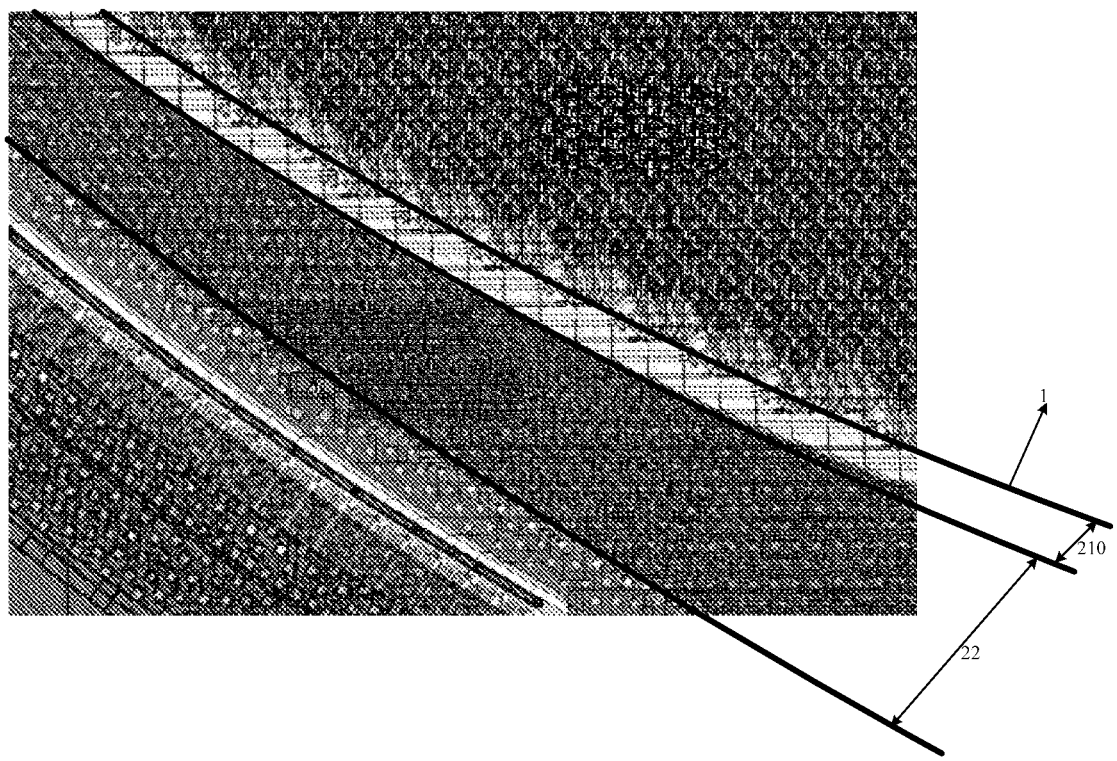
FIG. 2 is a top view of the enlarged structure in area A of FIG. 1.

In an embodiment of the present disclosure, there is provided a display panel which, as shown in FIGS. 1 and 2, includes: a display substrate 5. The display substrate 5 includes a display area 1 and a bezel area 2 a first area arranged around the periphery of the display area 1. The bezel area 2 includes a first area 21 a first area arranged around the periphery of the display area 1, and a second area 22 arranged around a periphery of the first area 21. The display substrate further includes a plurality of electrical functional layers located at different levels respectively and at least part of film layer patterns therein being partially superposed. At least part of the electrical functional layers are distributed in the display area 1, and at least part of the electrical functional layers are distributed in the first area 21 and the second area 22. The first area 21 has a higher light transmittance than the second area 22 and the display area 1. Generally, the transmittance of the first area 21 is 10% to 20%, the transmittance of the second area 22 is less than 1%, and the transmittance of the display area 1 is 2% to 8%.

By providing the first area 21 in the display substrate 5 having a higher light transmittance than the second area 22 and the display area 1, the first area 21 of the display substrate 5 has the highest transmittance for external light, the display area 1 has the secondary transmittance for external light, and the second region 22 has the lowest transmittance for external light. As a result, the external light passing through the first area 21 has a strong brightness contrast with that passing through the second area 22 and the display area 1, so that at least part of the first area 21 of the display substrate 5 can serve as an alignment mark when a subsequent film layer is disposed on the light-emitting side of the display substrate 5.

The display panel herein is an OLED (organic light-emitting diode) display panel.

By providing the first area 21 having a higher light transmittance than the second area 22 and the display area 1, when a subsequent film layer is disposed on the light-emitting side of the display substrate 5, a relative positional relation between the subsequent film layer and the at least part of the first area 21 can be adjusted so that a device used for alignment, such as a camera, can perform alignment by identifying patterns in bright and dark areas of a view field formed due to shielding of the subsequent film layer on the at least part of the first area 21, and thus, accurate alignment of the subsequent film layer is realized. Since the first area 21 is formed within an inner bezel area 2 of the display substrate 5, the first area 21 does not occupy other space of the display substrate 5, saving the space of the bezel area 2 of the display substrate. Using at least part of the first area 21 as the alignment mark can meet the not-very-high alignment precision requirement for the subsequent film layer, and using at least part of the first area 21 as the alignment mark does not affect the normal circuit structure and display effect of the display panel.

In some embodiments, the subsequent film layer may be attached to the light-emitting side of the display substrate 5 by bonding, or may be formed on the light-emitting side of the display substrate 5 by directly being manufactured there. Either manner will require using at least part of the first area 21 as an alignment mark for alignment.

In some embodiments, the first area 21 has a width L in a range of 10 to 350 μm in a direction away from the display area 1. The range of the width L of the first area 21 is set such that, on one hand, a sufficient adjustable space is provided for the alignment of the subsequent film layer and the display substrate, and, on the other hand, the alignment precision in provision of the subsequent film layer is ensured.

Optionally, the width L of the first area 21 in the direction away from the display area 1 is 150 μm. The width L of the first area 21 is an optimum width value obtained through experiments that can ensure alignment precision in provision of the subsequent film layer.

In an embodiment, the display substrate includes a transistor and an organic light-emitting diode electrically connected to the transistor. Each of the electrical functional layers includes a semiconductor layer, a gate layer, a source drain metal layer and an anode layer. The semiconductor layer includes an active layer of the transistor. The gate layer includes a gate line and a gate of the transistor. The source drain metal layer includes a source and a drain of the transistor, a data line and a power line. The anode layer includes an anode of the organic light-emitting diode. A distribution density of the electrical functional layers and the superposed parts thereof in the display area 1 is greater than that in the first area 21, and less than that in the second area 22. In this manner, the first area 21 of the display substrate has the highest transmittance for external light, the display area 1 has the secondary transmittance for external light, and the second region 22 has the lowest transmittance for external light. As a result, the external light passing through the first area 21 has a strong brightness contrast with that passing through the second area 22 and the display area 1, so that at least part of the first area 21 of the display substrate 5 can serve as an alignment mark in provision of the subsequent film layer. Meanwhile, the first area 21 is naturally formed after the electrical functional layers are formed, involving no separate preparation process, thereby optimizing the structure and the technological process of the display panel.

In some embodiments, each of the electrical functional layers further includes other functional layers disposed in the same level, for example: each electrical functional layer further includes an electrical switching layer formed in the first area and the second area. For example, the electrical switching layer VSS in the display area may be switched to the source drain metal layer through the anode layer.

Figure 3:
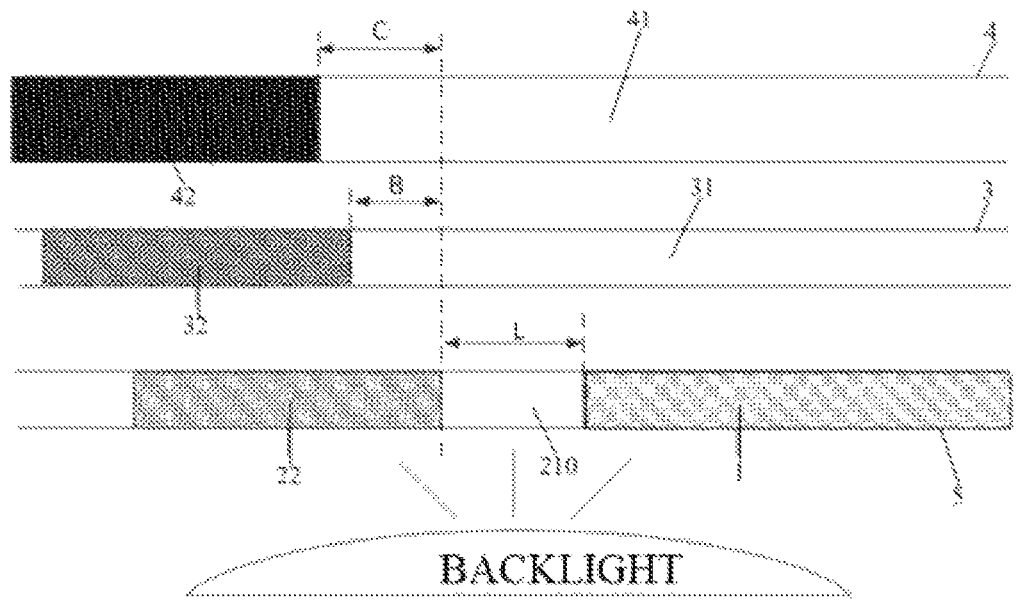
FIG. 3 is a structural cross-sectional view of a display panel according to an embodiment of the disclosure.

In some embodiments, as shown in FIG. 3, the display panel further includes a touch layer 3 disposed on a light-emitting side of the display substrate 5. The touch layer 3 includes a touch area 31 and a wiring area 32 arranged around a periphery of the touch area 31. The touch area 31 has the same shape as the display area 1. The display area 1 falls into an orthographic projection of the touch area 31 on the display substrate 5. In a plane of the display substrate 5 along the direction away from the display area 1, an orthographic projection of the wiring area 32 on the display substrate 5 is located on a side of the first area 21 away from the display area 1, and the wiring area 32 is spaced from the first area 21 by a first distance B. At least one pair of position areas 210 distributed oppositely in the first area 21 serve as alignment marks when the touch layer 3 is disposed on the display substrate 5. The provision of the first distance B facilitates alignment adjustment when the touch layer 3 is disposed on the display substrate 5.

In some embodiments, the first distance B is greater than 0 and less than a width of the second area 22 in a direction away from the display area 1. With such an arrangement, accurate alignment adjustment of the touch layer 3 disposed on the display substrate 5 can be achieved.

In some embodiments, the touch layer 3 is disposed such that a width L of the alignment mark in a direction away from the display area 1 satisfies $L \leq (B-\Delta b)/k$, where $0<k<1$; wherein B is the first distance; $\Delta b$ is a setting tolerance of the touch layer 3; and k is a minimum width change rate of the alignment mark recognizable by the alignment device. Only when the width L of the position area 210 serving as the alignment mark in the direction away from the display area 1 meets the above requirement, it is ensured that the setting tolerance of the touch layer 3 does not affect the alignment precision of the touch layer 3 when aligned with the display substrate 5, and thus the alignment precision requirement of the touch layer 3 can be met when aligned with the display substrate 5 through the alignment mark. For example, $\Delta b$ is 120 μm to 180 μm, B is 180 μm to 250 μm, and L is 10 to 350 μm.

In some embodiments, the display panel further includes a cover plate 4 disposed on a side of the touch layer 3 away from the display substrate 5. The cover plate 4 includes a central area 41 and an ink area 42 arranged around a periphery of the central area 41. The central area 41 has the same shape as the display area 1. The display area 1 falls into an orthographic projection of the central area 41 on the display substrate 5. In the plane of the display substrate 5 along the direction away from the display area 1, the ink area 42 is located on a side of the first area 21 away from the display area 1, and the ink area 42 is spaced from the first area 21 by a second distance C. At least one pair of position areas 210 distributed oppositely in the first area 21 serve as alignment marks when the cover plate 4 is disposed on the display substrate 5. The provision of the second distance C facilitates alignment adjustment when the cover plate 4 is disposed on the display substrate 5.

In some embodiments, the second distance C is greater than 0 and less than a width of the second area 22 in a direction away from the display area 1. With such an arrangement, accurate alignment adjustment of the touch layer 3 disposed on the display substrate 5 can be achieved.

In some embodiments, the cover plate 4 is disposed such that a width L of the alignment mark in a direction away from the display area 1 satisfies $L \leq (C-\Delta c)/k$ $(1-k)$, where $0<k<1$; wherein C is the second distance; $\Delta c$ is a setting tolerance of the cover plate 4; and k is a minimum width change rate of the alignment mark recognizable by the alignment device. For example, $\Delta c$ is 160 μm to 240 μm, C is 10 to 350 μm, and L is 10 to 350 μm. Only when the width L of the position area 210 serving as the alignment mark in the direction away from the display area 1 meets the above requirement, it is ensured that the setting tolerance of the cover plate 4 does not affect the alignment precision of the cover plate 4 when aligned with the display substrate 5, and thus the alignment precision requirement of the cover plate 4 can be met when aligned with the display substrate through the alignment mark.

In some embodiments, the second distance C is greater than the first distance B. In this manner, it is further realized that touch layer 3 disposed earlier and the cover plate 4 disposed later are both precisely aligned.

In some embodiments, the display area 1 has a rounded quadrangle shape, and a pair of diagonal position areas 210 in the first area 21 corresponding to a pair of diagonal position areas of the rounded quadrangle serve as the alignment marks. By using the pair of diagonal position areas 210 in the first area 21 corresponding to a pair of diagonal position areas of the rounded quadrangle as the alignment marks, the position of the display substrate remains fixed when a subsequent film layer is aligned with the display substrate, and the position of the subsequent film layer in a certain plane (parallel to the plane of the display substrate) is adjusted front and back, left and right, until peripheral areas of the subsequent film layer corresponding to the diagonal position areas 210 are at the same position relative to the respective diagonal position areas 210 (e.g., the peripheral areas of the subsequent film layer corresponding to the diagonal position areas 210 have the same distance from the respective diagonal position areas 210, or the peripheral areas of the subsequent film layer corresponding to the diagonal position areas 210 cover the same width of the respective diagonal position areas 210). Then, the alignment is considered to be completed, and the subsequent film layer can be set (e.g., by bonding). By using the pair of diagonal position areas 210 in the first area 21 corresponding to a pair of diagonal position areas of the rounded quadrangle serve as the alignment marks, a setting position of the subsequent film layer can be uniquely determined. Therefore, the alignment setting precision of the subsequent film layer can be ensured, as long as the pair of diagonal position areas 210 in the first area 21 corresponding to a pair of diagonal position areas of the rounded quadrangle meets the requirement of alignment precision.

In some embodiments, the quadrangle has a rectangle shape, and edge lines of the four corners of the rectangle are arcs, i.e. the four corners of the rectangle are all set as arc-shaped lead angles, and the quadrangle is a rounded quadrangle. Accordingly, edge lines of the pair of diagonal position areas 210 in the first area 21 corresponding to a pair of diagonal position areas of the rounded quadrangle serving as alignment marks are also arcs.

In some embodiments, the rounded quadrangle may be an arbitrary rounded quadrangle with an irregular shape, and the edge lines of the four corners of the quadrangle may be straight lines, i.e. no lead angle is provided at any of the four corners of the quadrangle, and accordingly, the edge lines of the pair of diagonal position areas serving as the alignment marks in the first area corresponding to a pair of diagonal position areas of the quadrangle may also be straight lines.

Figure 4:
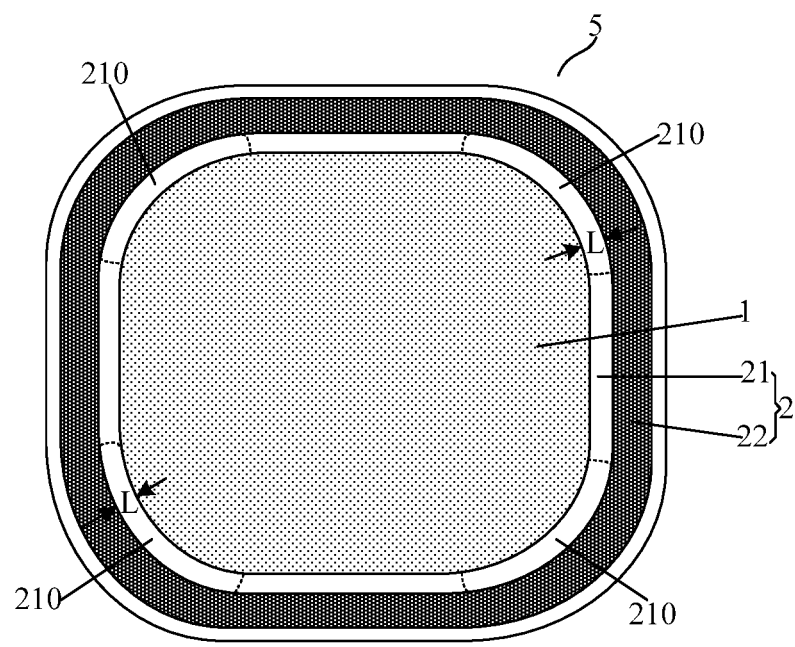
FIG. 4 is a top view of a display substrate in another display panel according to an embodiment of the present disclosure.

In some embodiments, as shown in FIG. 4, the display area 1 has a rounded quadrangle shape, and two pairs of diagonal position areas 210 in the first area 21 corresponding to two pairs of diagonal position areas of the rounded quadrangle serve as the alignment marks. By using two pairs of diagonal position areas 210 in the first area 21 corresponding to two pairs of diagonal position areas of the rounded quadrangle as the alignment marks, the alignment setting precision of the subsequent film layer can be further ensured under the condition that the setting position of the subsequent film layer is uniquely determined.

Figure 5:
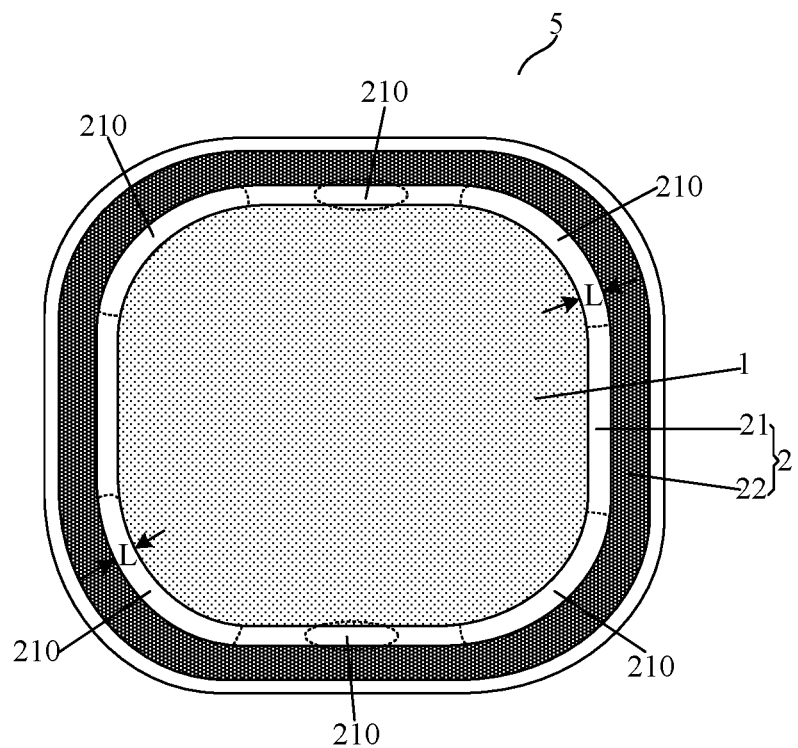
FIG. 5 is a top view of a display substrate in still another display panel according to an embodiment of the present disclosure.

Further, in some embodiments, as shown in FIG. 5, a position area 210 serving as the alignment mark is provided on each of at least one set of opposite sides in the first area 21 corresponding to at least one set of opposite sides of the rounded quadrangle. That is, each of the set of opposite sides of the rounded quadrangle is provided with a position area 210. That is, in the case that four angular position areas 210 in the first area 21 corresponding to four angular position areas of the rounded quadrangle serve as the alignment marks, two position areas 210 respectively disposed on two opposite sides in the first area 21 corresponding to the two opposite sides of the rounded quadrangle are further added as the alignment marks, that is, a total of six position areas 210 are provided as the alignment marks. With such an arrangement, the alignment setting precision of the subsequent film layer can be further ensured under the condition that the setting position of the subsequent film layer is uniquely determined compared with the previous setting scheme of alignment marks.

It should be noted that a plurality of position areas serving as the alignment marks may be added to a periphery in the first area corresponding to the rounded quadrangle so that the alignment setting precision of the subsequent film layer can be further ensured under the condition that the setting position of the subsequent film layer is uniquely determined.

Figure 6:
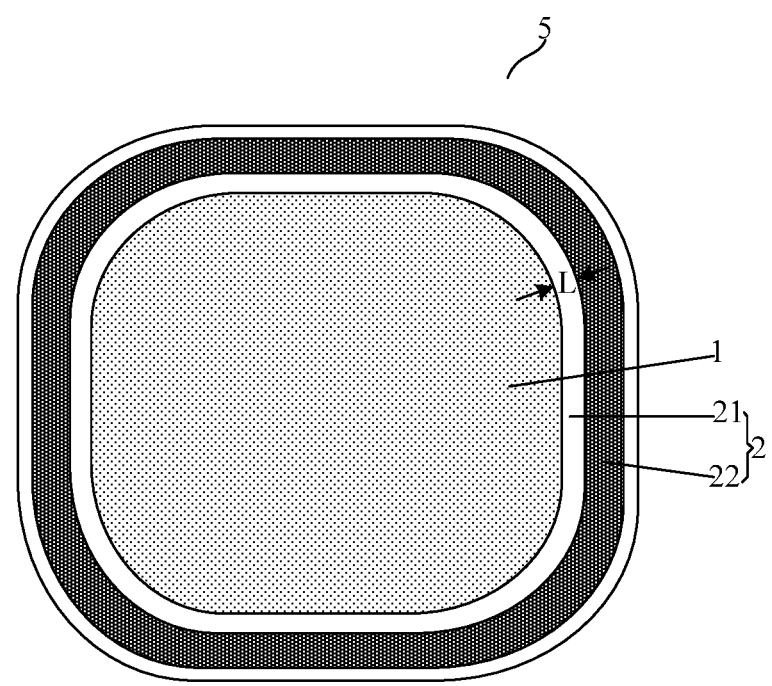
FIG. 6 is a top view of a display substrate in still another display panel according to an embodiment of the present disclosure.

In some embodiments, as shown in FIG. 6, the first area 21 as a whole serves as the alignment mark. The first area 21 is continuously and hermetically arranged around the periphery of the display area 1. With such an arrangement, the alignment setting precision of the subsequent film layer can be further ensured under the condition that the alignment position of the subsequent film layer is uniquely determined compared with the previous setting scheme of alignment marks.

Figure 7:
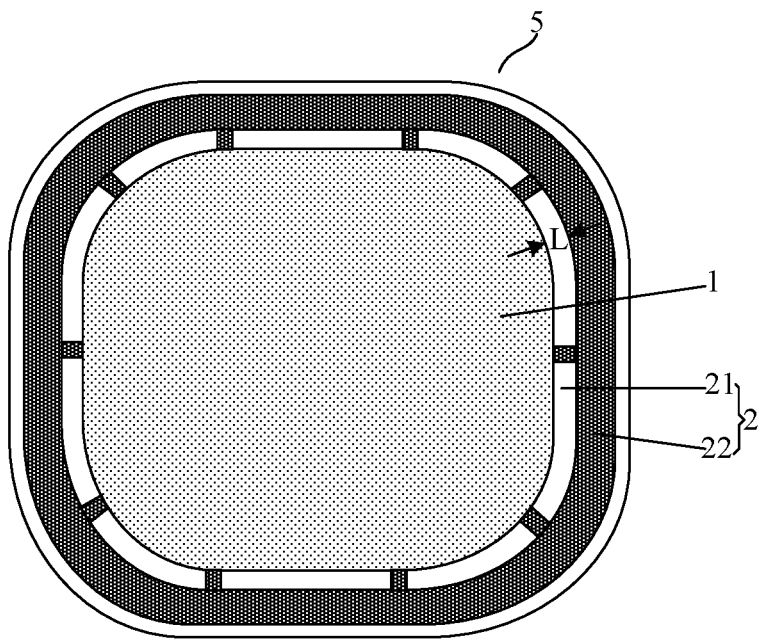
FIG. 7 is a top view of a display substrate in still another display panel according to an embodiment of the present disclosure.

It should be noted that, as shown in FIG. 7, the first area 21 may be intermittently arranged around the periphery of the display area 1, and the first area 21 as a whole serves as the alignment mark.

Based on the above structure of the display panel, in an embodiment of the present disclosure, there is further provided a method for preparing the display panel, including: step S1: preparing a display substrate.

The display substrate includes a display area and a bezel area arranged around a periphery of the display area. The bezel area includes a first area arranged around the periphery of the display area, and a second area arranged around a periphery of the first area. Preparing the display substrate includes preparing a plurality of electrical functional layers located at different levels respectively and at least part of film layers therein partially superposed. At least part of the electrical functional layers are distributed in the display area, and at least part of the electrical functional layers are distributed in the first area and the second area. The first area has a higher light transmittance than the second area and the display area.

The method for manufacturing the display panel further includes step S2: preparing a touch layer on a light-emitting side of the display substrate.

In some embodiments, preparing the touch layer on the light-emitting side of the display substrate includes: aligning the touch layer with the display substrate; and using at least one pair of position areas which are distributed oppositely in the first area as alignment marks when the touch layer is prepared.

Aligning the touch layer with the display substrate specifically includes: aligning the touch layer with the display substrate so that a touch area of the touch layer corresponds to the display area of the display substrate, and so that each position area of the display substrate serving as the alignment mark has the same exposed width relative to a wiring area of the touch layer.

In some embodiments, preparing the touch layer refers to attaching the touch layer to the light-emitting side of the display substrate, in which the touch layer and the display substrate need to be aligned, and then the touch layer is bonded to the display substrate.

In some embodiments, the method for manufacturing the display panel further includes step S3: preparing a cover plate on a side of the touch layer away from the display substrate.

In some embodiments, preparing the cover plate on the side of the touch layer away from the display substrate includes: aligning the cover plate with the display substrate having the touch layer; and using at least one pair of position areas which are distributed oppositely in the first area as alignment marks when the cover plate is prepared.

Aligning the cover plate with the display substrate having the touch layer specifically includes: aligning the cover plate with the display substrate so that a central area of the cover plate corresponds to the display area of the display substrate, and so that each position area of the display substrate serving as the alignment mark has the same exposed width relative to an ink area of the cover plate.

In some embodiments, preparing the cover plate refers to attaching the cover plate to the side of the touch layer away from the display substrate, in which the cover plate needs to be aligned with the display substrate before being attached to the display substrate.

Figure 8:
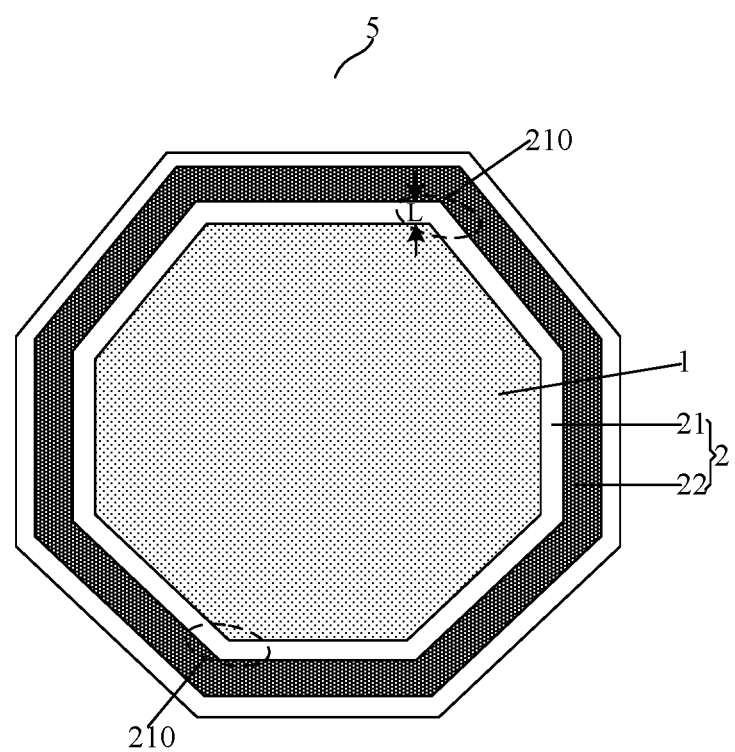
FIG. 8 is a top view of a display substrate in a display panel according to another embodiment of the present disclosure.

In an embodiment of the present disclosure, there is further provided a display panel which differs from the above embodiments in that, as shown in FIG. 8, the display area 1 has a polygon shape, two angular position areas 210 in the first area 21 corresponding to two angular position areas of the polygon serve as the alignment marks, and the two angular position areas 210 of the polygon are opposite to each other. The polygon includes, for example, a regular hexagon. By using two opposite angular position areas 210 in the first area 21 corresponding to two angular position areas of the polygon as the alignment marks, a setting position of the subsequent film layer can be uniquely determined. Therefore, the alignment setting precision of the subsequent film layer can be ensured, as long as the two opposite angular position areas 210 in the first area 21 corresponding to two angular position areas of the polygon meets the requirement of alignment precision.

It should be noted that the display area 1 may have an irregular polygonal shape.

Figure 9:
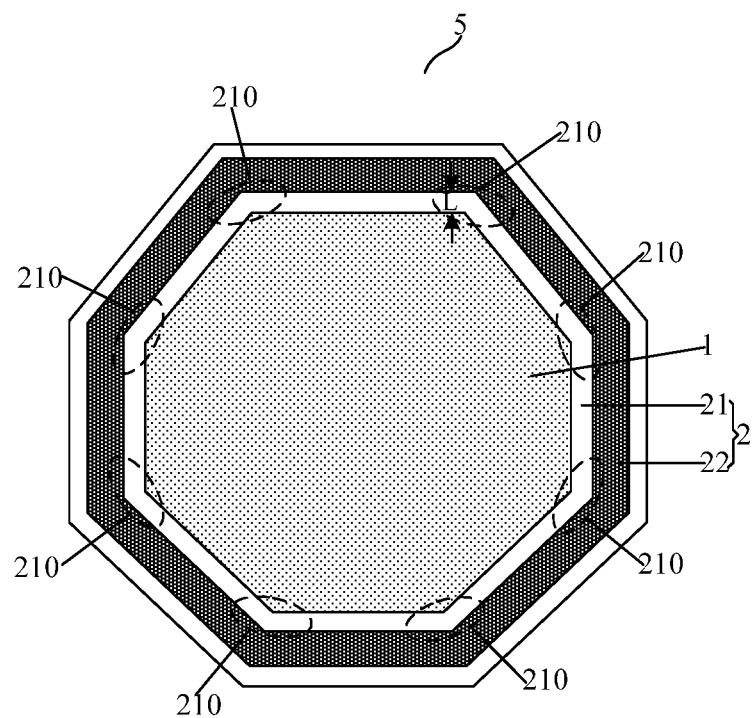
FIG. 9 is a top view of a display substrate in another display panel according to another embodiment of the present disclosure.

In some embodiments, as shown in FIG. 9, the display area 1 has a polygon shape. For example, the display area 1 has a regular hexagon shape, and each angular position area 210 in the first area 21 corresponding to each angular position area of the polygon serves as the alignment mark. By using each angular position area 210 in the first area 21 corresponding to each angular position area of the polygon as the alignment mark, the alignment setting precision of the subsequent film layer can be further ensured under the condition that the setting position of the subsequent film layer is uniquely determined. The display area 1 may have a regular or irregular polygonal shape.

Figure 10:
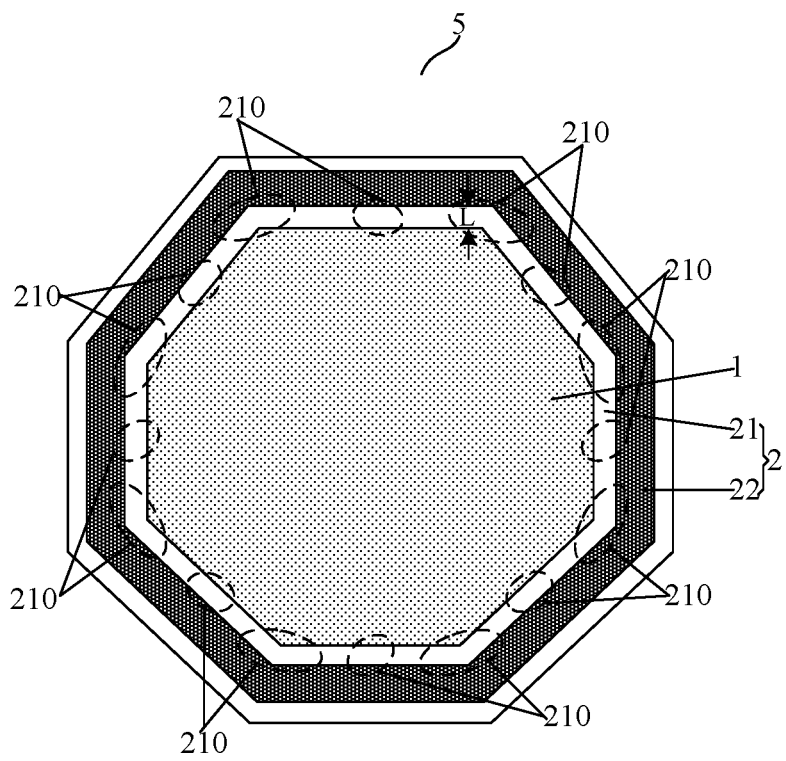
FIG. 10 is a top view of a display substrate in yet another display panel according to another embodiment of the present disclosure.

Further, in some embodiments, as shown in FIG. 10, a position area 21 as the alignment mark is provided on each side in the first area 210 corresponding to each side of the polygon. That is, in the case that each angular position area 210 in the first area 21 corresponding to each angular position area of the polygonal serves as the alignment mark, a position area 210 provided on each side in the first area 21 corresponding to each side of the polygon is further added as the alignment mark. That is, for a regular hexagon, a total of twelve position areas 210 are provided as the alignment marks. With such an arrangement, the alignment setting precision of the subsequent film layer can be further ensured under the condition that the setting position of the subsequent film layer is uniquely determined compared with the previous setting scheme of alignment marks.

It should be noted that a plurality of position areas serving as the alignment marks may be added to a periphery in the first area corresponding to the polygon so that the alignment setting precision of the subsequent film layer can be further ensured under the condition that the setting position of the subsequent film layer is uniquely determined.

Other structures of the display panel and the method for preparing a display panel in this embodiment are the same as those in the above embodiment, and thus are not repeated here.

In the display panel provided in the above embodiment, by providing the first area having a higher light transmittance than the second area and the display area, a relative positional relation between the subsequent film layer and the at least part of the first area 21 can be adjusted during alignment and provision of the subsequent film layer so that a device used for alignment, such as a camera, can perform alignment by identifying patterns in bright and dark areas of a view field formed due to shielding of the subsequent film layer on the at least part of the first area, and thus, accurate alignment of the subsequent film layer is realized. Since the first area is formed within an inner bezel area of the display substrate, the first area does not occupy other space of the display substrate, saving the space of the bezel area of the display substrate. Using at least part of the first area as the alignment mark can meet the not-very-high alignment precision requirement for the subsequent film layer, and using at least part of the first area as the alignment mark does not affect the normal circuit structure and display effect of the display panel.

In an embodiment of the present disclosure, there is further provided a display device including the display panel according to any one of the above embodiments.

By adopting the display panel according to any one of the above embodiments in the display device, the structure and the technological process of the display device are optimized, while the normal circuit structure and display effect of the display device are ensured.

The display device provided in the embodiments of the present disclosure may be any product or component having a display function, such as an OLED panel, an OLED television, an LCD panel, an LCD television, a monitor, a mobile phone, a navigator, and the like.

It will be appreciated that the above implementations are merely exemplary implementations for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

What is claimed is:

1. A display panel, comprising: a display substrate, wherein the display substrate comprises a display area and a bezel area arranged around a periphery of the display area, the bezel area comprising a first area arranged around the periphery of the display area, and a second area arranged around a periphery of the first area; and
the display substrate further comprises a plurality of electrical functional layers located at different levels respectively; wherein at least part of the plurality of electrical functional layers are partially superposed, at least part of the plurality of electrical functional layers are distributed in the display area, and at least part of the plurality of electrical functional layers are distributed in the first area and the second area, the first area having a higher light transmittance than the second area and the display area.

2. The display panel according to claim 1, wherein the first area has a width in a range of 10 to 350 μm in a direction away from the display area.

3. The display panel according to claim 2, wherein the display substrate comprises a transistor and an organic light-emitting diode electrically connected to the transistor;
the plurality of electrical functional layers comprise a semiconductor layer, a gate layer, a source drain metal layer and an anode layer;
the semiconductor layer comprises an active layer of the transistor; the gate layer comprises a gate line and a gate of the transistor; the source drain metal layer comprises a source and a drain of the transistor, a data line and a power line; and the anode layer comprises an anode of the organic light-emitting diode; and
a distribution density of the plurality of electrical functional layers and the superposed parts thereof in the display area is greater than that in the first area, and less than that in the second area.

4. The display panel according to claim 3, further comprising a touch layer disposed on a light-emitting side of the display substrate; wherein the touch layer comprises a touch area and a wiring area arranged around a periphery of the touch area;
the display area falls into an orthographic projection of the touch area on the display substrate; in a plane of the display substrate along the direction away from the display area, an orthographic projection of the wiring area on the display substrate is located on a side of the first area away from the display area, and the wiring area is spaced from the first area by a first distance; and
at least one pair of position areas distributed oppositely in the first area serve as alignment marks when the touch layer is disposed on the display substrate.

5. The display panel according to claim 4, wherein the first distance is greater than 0 and less than a width of the second area in the direction away from the display area.

6. The display panel according to claim 5, further comprising a cover plate disposed on a side of the touch layer away from the display substrate; wherein
the cover plate comprises a central area and an ink area arranged around a periphery of the central area;
the display area falls into an orthographic projection of the central area on the display substrate, and in the plane of the display substrate along the direction away from the display area, the ink area is located on the side of the first area away from the display area, and spaced from the first area by a second distance; and at least one pair of position areas which are distributed oppositely in the first area serve as alignment marks when the cover plate is disposed on the display substrate.

7. The display panel according to claim 6, wherein the second distance is greater than 0 and less than a width of the second area in the direction away from the display area.

8. The display panel according to claim 7, wherein the second distance is greater than the first distance.

9. The display panel according to claim 5, wherein the touch layer is disposed such that a width L of the alignment mark in the direction away from the display area satisfies $L \leq (B-\Delta b)/k$, where $0 < k < 1$; wherein B is the first distance;

$\Delta b$ is a setting tolerance of the touch layer; and k is a minimum width change rate of the alignment mark recognizable by an alignment device.

10. The display panel according to claim 7, wherein the cover plate is disposed such that a width L of the alignment mark in the direction away from the display area satisfies $L \leq (C-\Delta c)/k$ (1−k), where 0<k<1; wherein C is the second distance; $\Delta c$ is a setting tolerance of the cover plate; and k is a minimum width change rate of the alignment mark recognizable by an alignment device.

11. The display panel according to claim 4, wherein the display area has a rounded quadrangle shape, and a pair of diagonal position areas in the first area corresponding to a pair of diagonal position areas of the rounded quadrangle serve as the alignment marks.

12. The display panel according to claim 4, wherein the display area has a rounded quadrangle shape, and two pairs of diagonal position areas in the first area corresponding to two pairs of diagonal position areas of the rounded quadrangle serve as the alignment marks.

13. The display panel according to claim 12, wherein a position area serving as the alignment mark is provided on each of at least one set of opposite sides in the first area corresponding to at least one set of opposite sides of the rounded quadrangle.

14. The display panel according to claim 4, wherein the first area as a whole serves as the alignment mark.

15. The display panel according to claim 4, wherein the display area has a polygon shape, two angular position areas in the first area corresponding to two angular position areas of the polygon serve as the alignment marks, and the two angular position areas of the polygon are opposite to each other.

16. The display panel according to claim 4, wherein the display area has a polygon shape, and each angular position area in the first area corresponding to each angular position area of the polygon serves as the alignment mark, and a position area as the alignment mark is provided on each side in the first area corresponding to each side of the polygon.

17. A display device, comprising the display panel according to claim 1.

18. A method for preparing a display panel, comprising: preparing a display substrate; wherein
the display substrate comprises a display area and a bezel area arranged around a periphery of the display area, the bezel area comprising a first area arranged around the periphery of the display area, and a second area arranged around a periphery of the first area; and preparing the display substrate comprises preparing a plurality of electrical functional layers located at different levels respectively; wherein at least part of the plurality of electrical functional layers are partially superposed, at least part of the plurality of electrical functional layers are distributed in the display area, and at least part of the plurality of electrical functional layers are distributed in the first area and the second area, the first area having a higher light transmittance than the second area and the display area.

19. The method for preparing a display panel according to claim 18, further comprising: preparing a touch layer on a light-emitting side of the display substrate; wherein
preparing the touch layer on the light-emitting side of the display substrate comprises: aligning the touch layer with the display substrate; and using at least one pair of position areas which are distributed oppositely in the first area as alignment marks when the touch layer is prepared; and
aligning the touch layer with the display substrate comprises:
aligning the touch layer with the display substrate so that a touch area of the touch layer corresponds to the display area of the display substrate, and so that each position area of the display substrate serving as the alignment mark has the same exposed width relative to a wiring area of the touch layer.

20. The method for preparing a display panel according to claim 19, further comprising: preparing a cover plate on a side of the touch layer away from the display substrate; wherein preparing the cover plate on the side of the touch layer away from the display substrate comprises: aligning the cover plate with the display substrate having the touch layer; using at least one pair of position areas which are distributed oppositely in the first area as alignment marks when the cover plate is prepared; and
aligning the cover plate with the display substrate having the touch layer comprises:
aligning the cover plate with the display substrate so that a central area of the cover plate corresponds to the display area of the display substrate, and so that each position area of the display substrate serving as the alignment mark has the same exposed width relative to an ink area of the cover plate.

* * * * *